(12) United States Patent
Segovia et al.

(10) Patent No.: US 11,251,809 B2
(45) Date of Patent: Feb. 15, 2022

(54) SOFT-AIDED DECODING OF STAIRCASE CODES

(71) Applicant: Technische Universiteit Eindhoven, Eindhoven (NL)

(72) Inventors: Alex Enrique Alvarado Segovia, 's-Hertogenbosch (NL); Yi Lei, Hefei (CN); Bin Chen, Hefei (CN); Gabriele Liga, Eindhoven (NL)

(73) Assignee: Technische Universiteit Eindhoven, Eindhoven (NL)

( * ) Notice: Subject to any disclaimer, the term of this patent is extended or adjusted under 35 U.S.C. 154(b) by 0 days.

(21) Appl. No.: 15/734,544

(22) PCT Filed: Jul. 9, 2019

(86) PCT No.: PCT/EP2019/068348
§ 371 (c)(1),
(2) Date: Dec. 2, 2020

(87) PCT Pub. No.: WO2020/011761
PCT Pub. Date: Jan. 16, 2020

(65) Prior Publication Data
US 2021/0234555 A1 Jul. 29, 2021

Related U.S. Application Data

(60) Provisional application No. 62/695,498, filed on Jul. 9, 2018, provisional application No. 62/800,081, filed on Feb. 1, 2019.

(51) Int. Cl.
*H03M 13/11* (2006.01)
*H03M 13/15* (2006.01)
*H03M 13/19* (2006.01)
*H03M 13/39* (2006.01)
*H03M 13/43* (2006.01)

(52) U.S. Cl.
CPC .... *H03M 13/1108* (2013.01); *H03M 13/1111* (2013.01); *H03M 13/152* (2013.01); *H03M 13/1515* (2013.01); *H03M 13/19* (2013.01); *H03M 13/3927* (2013.01); *H03M 13/43* (2013.01)

(58) Field of Classification Search
CPC .................................................. H03M 13/3707
USPC .................................. 714/764, 762, 765, 767
See application file for complete search history.

(56) References Cited

U.S. PATENT DOCUMENTS

2006/0136797 A1* 6/2006 Cai .................. H03M 13/3723
714/752
2019/0104121 A1* 4/2019 Khandani ............. H04L 9/0891

OTHER PUBLICATIONS

Chen et al. Improved Decoding of Staircase Codes: The Soft-Aided bit-marking (SABM) algorithm. eprint arXiv:1902.01178 Feb. 2019.

* cited by examiner

*Primary Examiner* — Fritz Alphonse
(74) *Attorney, Agent, or Firm* — Lumen Patent Firm

(57) ABSTRACT

A hard-decision (HD) forward error correcting (FEC) coded signal is decoded by a decoder to produce decoded bits using marked reliable bits of the HD-FEC coded signal and marked unreliable bits of the HD-FEC coded signal. The marked reliable and unreliable bits are computed by calculation and marking blocks based on an absolute value of log-likelihood ratios of the HD-FEC coded signal. The HD-FEC coded signal may be, for example, a staircase code coded signal or a product code coded signal.

20 Claims, 9 Drawing Sheets

SOFT-AIDED DECODING OF STAIRCASE CODES

CROSS-REFERENCE TO RELATED APPLICATIONS

This application is a 371 of PCT application PCT/EP2019/068348 filed Jul. 9, 2019. PCT application PCT/EP2019/068348 claims the benefit of U.S. Provisional application 62/695,498 filed Jul. 9, 2018. PCT application PCT/EP2019/068348 claims the benefit of U.S. Provisional application 62/800,081 filed Feb. 1, 2019.

FIELD OF THE INVENTION

The present invention relates generally to digital communications systems and methods. More specifically, it relates to hard-decision-based codes and techniques for efficient decoding thereof.

BACKGROUND OF THE INVENTION

Forward error correction (FEC) is a technique that inserts redundancy in a signal that allows a decoder to correct errors in the received signal. It is used, for example, in optical communication systems to meet the ever increasing data demands in optical transport networks (OTNs). FEC codes that can boost the net coding gain (NCG) are of key importance. Examples of important FEC codes are Reed-Solomon (RS) codes and Bose-Chaudhuri-Hocquenghem (BCH) codes, which have variants defined by parameters. BCH codes are denoted as $BCH(n_c, k_c, t)$, where $n_c$, $k_c$, and t denote the codeword length, information length, and error-correcting capability, respectively. In order to increase transmission data rate and distance, super FECs have been developed that use two concatenated FEC codes, such as BCH(3860, 3824, 3)+BCH(2040, 1930, 10) codes, RS(1023, 1007)+BCH(2047, 1952, 8) codes, etc. Despite these improvements, FEC codes with higher NCG are needed.

Although soft-decision (SD) FEC codes provide large NCGs, they are not the best candidates for very high data rate applications due to their high power consumption and decoding latency. For applications with strict latency and complexity requirements (e.g., short reach), simple but powerful hard-decision (HD) FEC codes, e.g., product codes (PCs) and staircase codes (SCCs), are promising. Staircase codes (SCCs) are popular low-complexity high-performance forward error correcting codes. As the optical transport networks (OTNs) move forward for 400 Gb/s and beyond data rates, simple but powerful SCCs have attracted much attention. Improving the decoding performance of SCCs is the focus of attention for many researchers and companies.

Both SCCs and PCs are based on simple component codes, BCH codes being the most popular ones. The decoding is done iteratively based on bounded-distance decoding (BDD) for the component codes.

Although simple to implement, one drawback of BDD is that its error-correcting capability is limited to $t=[(d_0-1)/2]$, where $d_0$ is the minimum Hamming distance (MHD) of the component code. BDD can detect more than t errors, but cannot correct them. In some cases, BDD may also erroneously decode a received sequence with more than t errors, a situation known as a miscorrection. Miscorrections are known to degrade the performance of iterative BDD. To prevent miscorrections and/or extend the error correcting capability, several methods have been studied in the literature. In what follows we review those methods.

One known approach to preventing miscorrections in SCCs is rejecting bit-flips from the decoding of bit sequences associated with the last SCC block if they conflict with a zero-syndrome codeword from the previous block. The obtained gains of this approach, however, are expected to be limited. Another known approach is an anchor-based decoding algorithm, where some bit sequences are labeled as anchor codewords. These sequences are considered to have been decoded without miscorrections. Decoding results that are inconsistent with anchor codewords are discarded. Although this algorithm works well with both SCCs and PCs, it suffers from an increased complexity as anchor codewords need to be tracked during iterative BDD. In another approach, a modified iterative BDD for PCs uses channel reliabilities to perform the final HD at the output of BDD, instead of directly accepting the decoding result. Large gains are obtained, but it requires additional memory (and processing) as all the soft information needs to be saved. This proposal was later simplified to only require 1-bit additional reliability memory with minor performance degradation. Later on, the component BDD decoder was replaced by generalized minimum distance decoding, which treats bits with least reliability as erasures, to obtain more gains. Furthermore, Hamming distance has taken the place of generalized distance to avoid the exchange of soft information in the decoding process and reduce the internal decoder data flow.

In one known approach to extend error correcting capability, three kinds of algorithms are used to decode block codes with channel soft information. In this class of algorithm, each bit is accompanied with a confidence value, according to the soft information. During the decoding, the algorithms will generate a sequence of test patterns first, then decode all of them and choose the decoding result with lowest analog weight as the final output. Using this technique, the error correcting capability can be extended from $[(d_0-1)/2]$ to $d_0-1$. The main drawback of these three algorithms is that the decoder needs to decode at least $[(d_0/2)+1]$ test patterns even though not all of them are necessary. This significantly increases the decoding complexity and latency.

SUMMARY OF THE INVENTION

In one aspect, the invention provides a simple and effective algorithm to improve the decoding of HD-FEC codes (e.g., SCCs and PCs), without significantly increasing the complexity and latency.

The invention provides, in one aspect, a decoding algorithm, which partially uses soft information from the channel. The algorithm is based on the idea of marking certain number of highly reliable and highly unreliable bits. The marked highly reliable bits are used to improve the miscorrection-detection capability of the decoder. The marked highly unreliable bits are used to improve the error-correcting capability of BDD through a bit flipping mechanism.

The algorithm jointly increases the miscorrection-detection capability of decoder and the error-correcting capability of BDD. The technique is efficient for SCCs because in that case it suffices to modify the decoding structure related to the latest code block. Furthermore, the algorithm is based on marking bits only, and thus, no soft bits (log-likelihood ratios, LLRs) need to be saved. Marked bits do not need to be tracked during the iterative process either.

Techniques of this invention are also suitable for other hard-decision codes that the optical communication community is interested in (e.g., Hamming codes, BCH codes and Reed-Solomon codes). The algorithm could in principle boost the performance of all these codes. On the other hand, hard-decision-based codes are also used in wireless communications to ensure the reliable transmission of information. Therefore, techniques of this invention can also be used in wireless communications to prevent miscorrections and extend the error-correcting capability of BDD. Moreover, SCCs have also attracted much attention from the security fields, e.g., using SCCs to construct threshold changeable secret sharing.

In one aspect, the techniques of this disclosure may be implemented in a communication system of FIG. 1 by a system comprising: a transmitter including a staircase encoder or encoder circuit, for example a FEC encoder (SCC encoder; a mapper or mapper circuit, for example a M-PAM Mapper; a receiver including a staircase decoder circuit coupled to a demapper circuit; and an LLR bit marking circuit and an LLR calculation circuit.

The LLR marking circuit and the LLR calculation circuit together improve the performance of the staircase decoder and provide the improved receiver. Alternatively, the circuits are computational circuits and a decoder is a circuit that changes a code into a set of signals.

In another aspect, the invention provides an apparatus, such as, a data processor, a receiver or transceiver, include at least the following components a processor; and a memory including computer program instructions, the processor, the memory and the computer program instructions being configured to cause the processor to perform a method of decoding, the method including the steps described in the flow chart of the improved and efficient algorithm as described in this disclosure.

The staircase decoder or decoder circuit comprising the improved algorithmic steps of the disclosure may be a processor or data processor unit for use with any device using communication channels for example of an optical network or any wired or wireless network. The channels described above may be at least communication channels or memory channels, and the signals to be decoded may be transitory signals or non-transitory signals.

Embodiments of the invention may be implemented using FPGAs or be part of an ASIC. It may also be implemented in a digital signal processor, on a graphics processing unit (GPU), or general purpose central processing unit (CPU). Alternatively, the algorithm may be represented as a computer program product stored on a storage device which may be inserted into a device such as a receiver or transceiver for use in a communication networks or systems and channels as described herein. Alternatively, the algorithm may be embodied in software that can be downloaded and loaded into a device.

Embodiments of the invention can also be used in wireless communications to prevent miscorrections and extend the error-correcting capability of BDD.

The disclosure includes description of an optimization process of marking bits as highly reliable, and an analysis to show the complexity of the algorithm. The disclosure also demonstrates this algorithm may be implemented for product codes (another FEC code).

In one aspect, the invention provides a method for decoding a hard-decision (HD) forward error correcting (FEC) coded signal received by a device over a communication channel (e.g., optical, wired, or wireless). The hard-decision (HD) forward error correcting (FEC) coded signal may be, for example, a staircase code (SCC) coded signal, a product code (PC) coded signal, a Hamming code coded signal, a BCH code coded signal, or a Reed-Solomon code coded signal. The method comprises decoding the HD-FEC coded signal by the device to produce decoded bits, wherein the decoding uses marked reliable bits of the HD-FEC coded signal and marked unreliable bits of the HD-FEC coded signal.

In some instances, the decoding comprises: estimating code bits from the coded signal by an HD-based demapper; and generating the decoded bits from the estimated code bits by an HD-FEC decoder. In some instances, the decoding comprises: computing the marked bits based on an absolute value of log-likelihood ratios (LLRs) of the HD-FEC coded signal. In some instances, the decoding comprises: marking a bit of the HD-FEC coded signal as a reliable bit whenever an absolute value of a log-likelihood ratio for the bit exceeds a predetermined threshold $\delta$, e.g., $\delta=10$, or $\delta=11$, or $\delta=12$. In some instances, the decoding comprises: sorting bits of the HD-FEC coded signal by the log-likelihood ratios for the bits and marking a subset of the sorted bits having lowest log-likelihood ratios as unreliable bits. In some instances, the decoding comprises detecting miscorrections and flipping bits whenever a miscorrection is detected.

In another aspect, the invention provides a device for decoding a hard-decision (HD) forward error correcting (FEC) coded signal received by the device, the device comprising: a bit-marking circuit adapted to produce marked reliable bits of the HD-FEC coded signal and marked unreliable bits of the HD-FEC coded signal; and an HD-FEC decoder adapted to decode the HD-FEC coded signal received by the device to produce decoded bits, wherein the HD-FEC decoder uses the marked reliable bits and the marked unreliable bits. In some instances, the HD-FEC decoder comprises an HD-based demapper adapted to estimate code bits from the coded signal; and a bounded distance decoder (BDD) adapted to decode the decoded bits from the estimated code bits using the marked reliable bits and the marked unreliable bits.

In some instances, the bit-marking circuit is adapted to compute the marked reliable bits and the marked unreliable bits based on an absolute value of log-likelihood ratios (LLRs) of the HD-FEC coded signal. In some instances, the bit-marking circuit is adapted to mark a bit of the HD-FEC coded signal as a reliable bit whenever an absolute value of a log-likelihood ratio for the bit exceeds a predetermined threshold $\delta$, e.g., $\delta=10$, or $\delta=11$, or $\delta=12$. In some instances, the bit marking circuit is adapted to sort bits of the HD-FEC coded signal by the log-likelihood ratios of the bits and to mark a subset of the sorted bits having lowest log-likelihood ratios as unreliable bits.

In another aspect, the invention provides a system for communicating a hard-decision (HD) forward error correcting (FEC) coded signal, the device comprising: a transmitter adapted to transmit the hard-decision (HD) forward error correcting (FEC) coded signal; a receiver adapted to receive the hard-decision (HD) forward error correcting (FEC) coded signal; wherein the receiver comprises a device for decoding as described in the paragraphs above.

DETAILED DESCRIPTION

Forward error correcting (FEC) codes, such as staircase codes (SCCs), are typically decoded using iterative bounded-distance decoding (BDD) and hard decisions. Embodiments of the present invention provide techniques for decoding hard-decision (HD) forward error correcting (FEC) codes using soft information from the channel. In particular, the technique involves marking highly reliable and highly unreliable bits. These marked bits are used to improve the miscorrection-detection capability of a SCC decoder and the error-correcting capability of BDD. For SCCs with 2-error-correcting Bose-Chaudhuri-Hocquenghem (BCH) component codes, the technique improves upon standard SCC decoding by up to 0.30 dB at a bit-error rate (BER) of $10^{-7}$. The technique achieves almost half of the gain achievable by an genie decoder with this structure. A complexity analysis based on the number of additional calls to the component BDD decoder shows that the relative complexity increase is only around 4% at a BER of $10^{-4}$. This additional complexity is shown to decrease as the channel quality improves. In addition to applications to staircase codes, the technique can also be applied to product codes, where simulation results show that the technique offers gains of up to 0.34 dB at a BER of $10^{-7}$.

The present disclosure describes a soft-aided bit-marking (SABM) algorithm to improve the decoding of HD-FEC codes such as SCCs and PCs. The SABM algorithm includes marking highly reliable and highly unreliable bits. The SABM algorithm jointly increases the miscorrection-detection capability of the SCC decoder and the error-correcting capability of BDD. SABM also has low complexity. For SCCs, the SABM algorithm can function with modifications only to the decoding structure of the last block of each decoding window. Furthermore, in the SABM algorithm each component code does not need to be decoded more than twice. Also, the algorithm is based on marking bits only, and thus, no soft bits (log-likelihood ratios, LLRs) need to be stored. In addition, marked bits do not need to be tracked during the iterative process.

System Model, SCCS, and BDD For purposes of illustration only, and without loss of generality, the techniques of the present invention will be described in detail for the case of SCCs. Those skilled in the art will appreciate that the bit-marking techniques apply as well to other HD-FEC codes.

System Model

Figure 1:
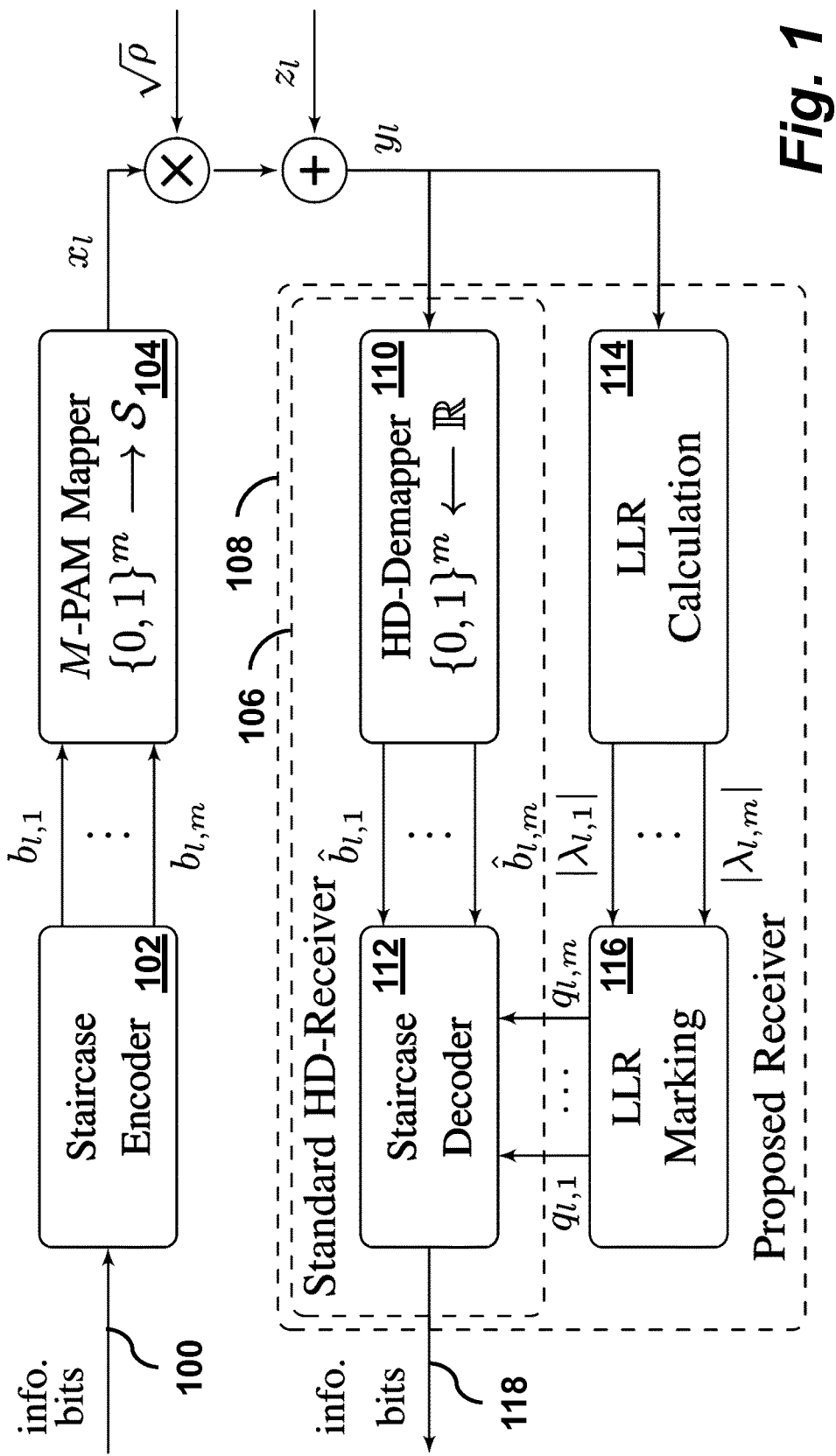
FIG. 1 is a block diagram illustrating a system model for decoding a hard-decision (HD) forward error correcting (FEC) code, according to an embodiment of the invention applied to staircase codes.

As shown in FIG. 1, information bits 100 are encoded by a staircase encoder 102 to produce bits $b_{l,1}, \ldots, b_{l,m}$, which are then mapped by a M-PAM Mapper 104 to symbols $x_l$ taken from an equally-spaced M-ary Pulse Amplitude Modulation (PAM) constellation $S=\{s_1, s_2, \ldots, s_M\}$ with $M=2^m$ points, where l is the discrete time index. The bit-to-symbol mapping is the binary reflected Gray code. The received signal is $y_l=\sqrt{\rho}x_l+z_l$, where $z_l$ is zero-mean unit-variance additive white Gaussian noise (AWGN) and $\sqrt{\rho}$ is the channel gain.

The standard HD receiver structure 106 for SCCs uses an HD-based demapper 110 to estimate the code bits, $\hat{b}_{l,1}, \ldots, \hat{b}_{l,m}$, which are then fed to the FEC decoder 112, which produces decoded information bits 118. In an embodiment of the invention, the receiver architecture 108 adapts the HD-FEC decoder 106 to use soft information from the channel produced by LLR calculation block 114 and LLR marking block 116. In particular, in addition to the HD-estimated bits $\hat{b}_{l,1}, \ldots, \hat{b}_{l,m}$, a sequence of marked bits denoted by $q_{l,k}$ are also provided to the decoder 112 by the LLR marking block 116. We call this architecture soft-aided (SA) HD-FEC decoding. These marked bits can be highly reliable bits (HRBs), highly unreliable bits (HUBs), or unmarked bits. The marking is determined by the LLR marking block 116 based on the absolute value of the LLRs $|\lambda k_{l,k}|$, which are computed from the signal $y_l$ by the LLR calculation block 114. The LLRs may be calculated as $$\lambda_{l,k} = \sum_{b \in \{0,1\}} (-1)^{\bar{b}} \log \sum_{i \in \mathcal{I}_{k,b}} \exp\left(-\frac{(y_l - \sqrt{\rho}s_i)^2}{2}\right), \quad (1)$$

with k=1, ..., m, and where $\bar{b}$ denotes bit negation. In Eq. 1 above, the set $I_{k,b}$ enumerates all the constellation points in S whose k-th bit $c_{i,k}$ is b, i.e., $I_{k,b}=\{i=1, 2, \ldots, M: c_{i,k}=b\}$. More details about the marking procedure and how this can be exploited by the decoder will be given later.

Staircase Codes

Figure 2:
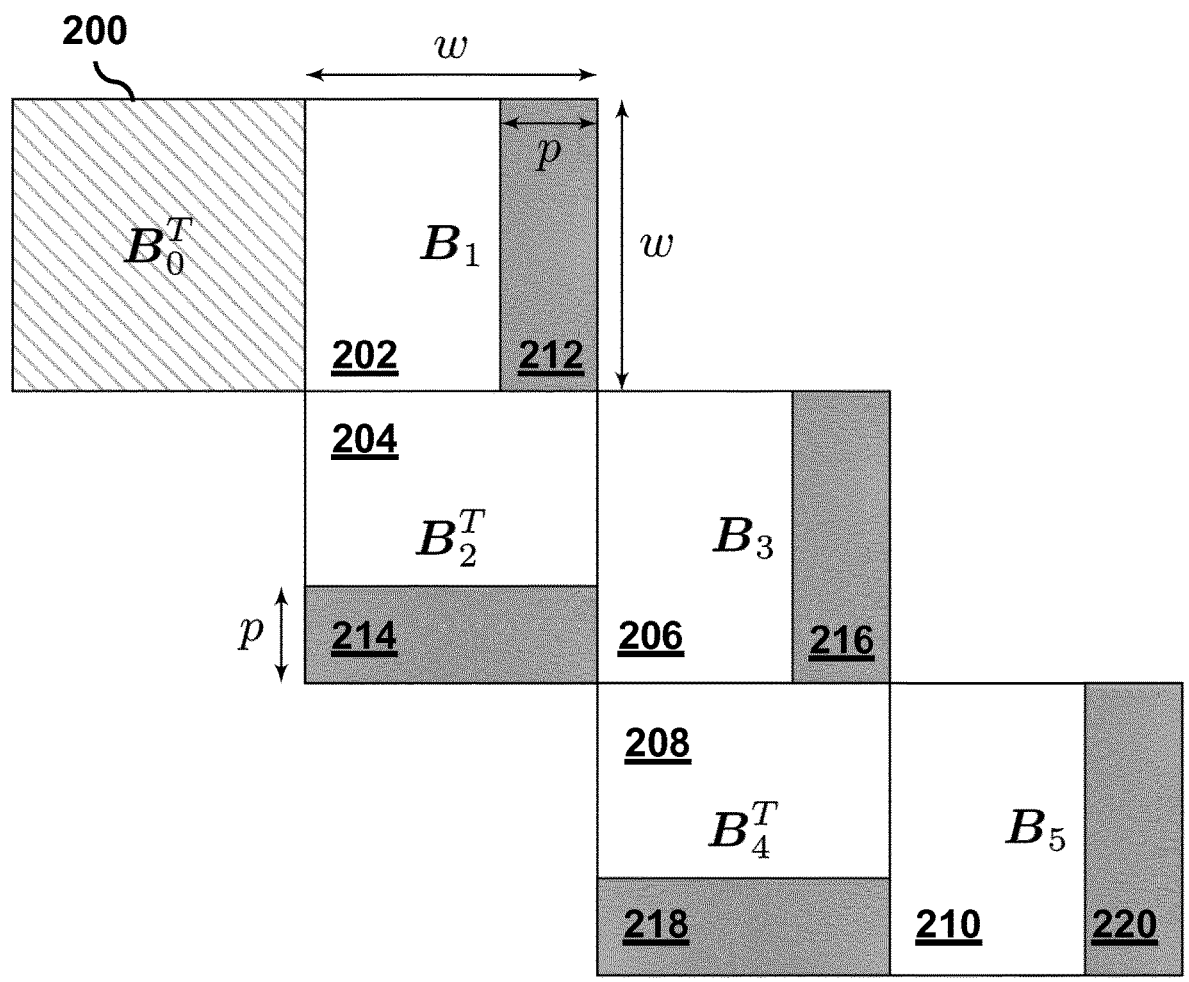
FIG. 2 is a schematic diagram illustrating the structure of a staircase code, which is a type of hard-decision (HD) forward error correcting (FEC) code decoded by embodiments of the invention.

FIG. 2 shows the staircase structure of SCCs considered in this embodiment, where block $B_0$ 200 is initialized to all zeros. Each subsequent SCC block $B_i$, i=1, 2, ..., is composed of w(w−p) information bits (shown in FIG. 2 as white regions 202, 204, 206, 208, 210) and wp parity bits (shown in FIG. 2 as gray regions 212, 214, 216, 218, 220). Each row of the matrix $[B^T_{i-1}B_i]$ $\forall i>1$ is a valid codeword in a component code C. We consider the component code C to be a binary code with parameters ($n_c$, $k_c$, t). Then, w and p are given by: $w=n_c/2$ and $p=n_c-k_c$. The code rate R of the SCC is $R=1-p/w=2k_c/n_c-1$. In this embodiment, the component codes C considered are extended (by 1 additional parity bit) BCH codes. The mapping between code bits and symbols is done by reading row-by-row the SCC blocks $B_i$, i=1, 2, . . . .

At the receiver side, SCCs are decoded iteratively using a sliding window covering L blocks. We use $Y_i$ to indicate the received SCC block after HD-demapper corresponding to the transmitted block $B_i$. The decoder first iteratively decodes the blocks $\{Y_0, \ldots, Y_{L-1}\}$. When a maximum number of iterations 1 is reached, the decoding window outputs the block $Y_0$ and moves to decode the blocks $\{Y_1, \ldots, Y_L\}$. The block $Y_1$ is then delivered and operation continues on $\{Y_2, \ldots, Y_{L+1}\}$ This process continues indefinitely. Multiple decoding scheduling alternatives exist. We chose in this example embodiment the most popular one, namely, alternated decoding of pairs of SCC blocks within a window, from the bottom right to the top left of the SCC window.

Bounded-Distance Decoding

BDD is used to decode (in Hamming space) the received bit sequence for the component code C. To correct up to t errors, the MHD $d_0$ of C must satisfy $d_0 \geq 2t+1$ ($d_0 \geq 2t+2$ for extended BCH codes with 1 additional parity bit). Thus, every codeword in the code C can be associated to a sphere of radius t. Within such a sphere, no other codewords exist. If the received sequence r falls inside one of these spheres, BDD will decode r to the corresponding codeword. Otherwise, BDD will declare a failure. For a given transmitted codeword c and a received sequence r, the BDD output ĉ is thus given by $$\hat{c} = \begin{cases} c, & \text{if } d_H(r, c) \leq t \\ \tilde{c} \in C', & \text{if } d_H(r, c) > t \text{ and } d_H(r, \tilde{c}) \leq t, \\ r, & d_H(r, \tilde{c}) > t \;\forall \tilde{c} \in C' \end{cases} \quad (2)$$

where $d_H(\cdot, \cdot)$ represents the Hamming distance. In practice, BDD is often a syndrome-based decoder that uses syndromes to estimate the error pattern e. If the syndromes are all zeros, no errors are present. For the first two cases in Eq. 2, BDD will both declare decoding success and $\hat{c}=r\oplus e$. In the second case, although BDD will still return an error pattern e, this case corresponds to a miscorrection. In the next section, we will show how to improve miscorrection detection (MD) using the underlying structure of SCCs and the marked HRBs.

The SABM Algorithm

Figure 3:
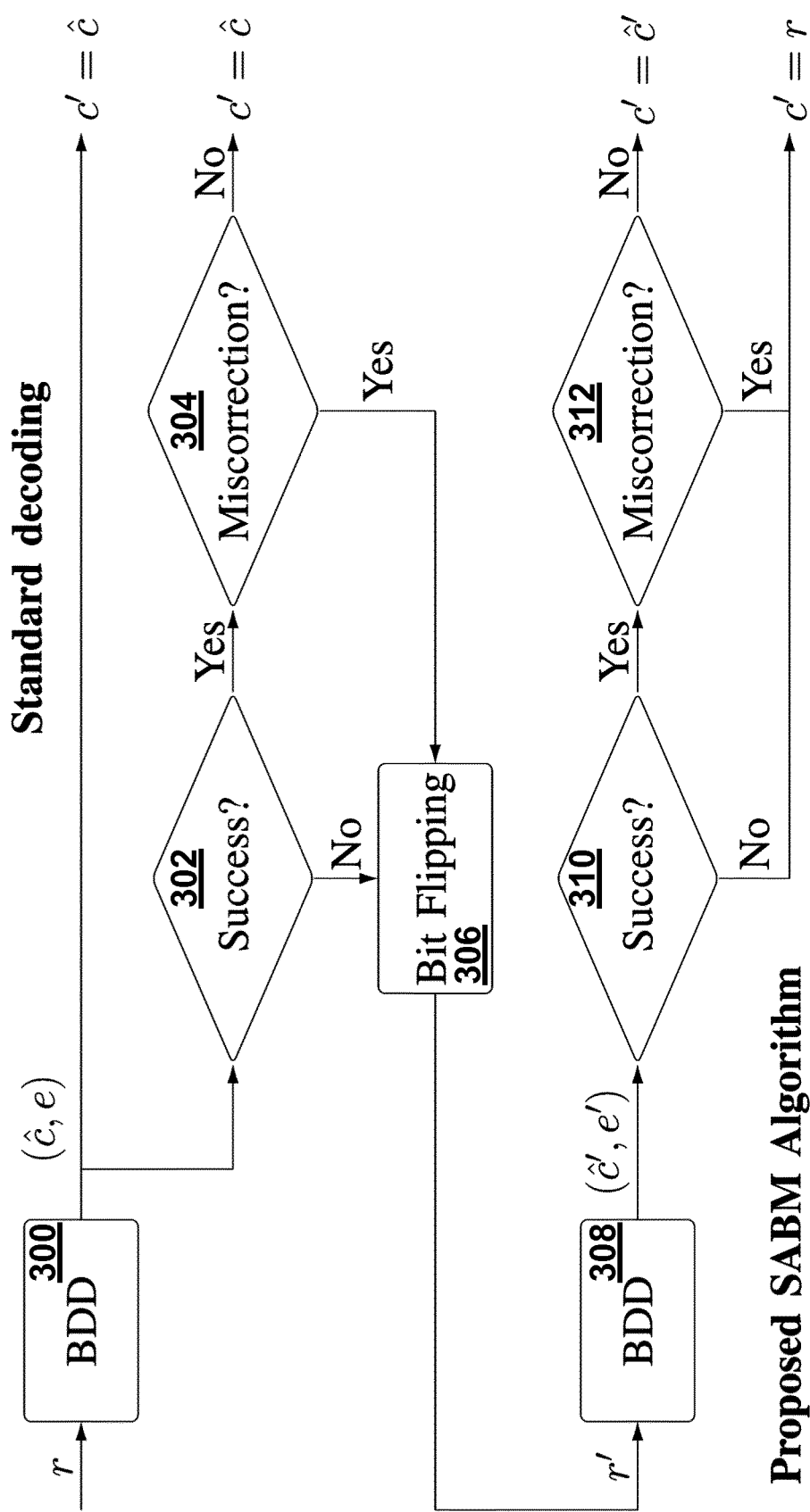
FIG. 3 is a flow chart illustrating steps in a method for decoding a hard-decision (HD) forward error correcting (FEC) code, according to an embodiment of the invention applied to staircase codes.

A flow chart of the SABM algorithm is shown in FIG. 3. For purposes of illustration, we assume that decoding is being performed over the blocks $\{Y_i, Y_{i+1}, \ldots, Y_{i+L-1}\}$. Then the input r is given by a row sequence taken from two neighbor blocks $[Y^T_{i+j-1} Y_{i+j}]$, where $j \in \{1, 2, \ldots, L-1\}$. That is, the input r is the received row sequence taken from two neighbor SCC blocks and c' is the output of the staircase decoder. In standard decoding, the BDD block 300 returns a decoded codeword ĉ based on Eq. 2 and an error pattern e, as indicated by the top horizontal line in FIG. 3. That is, it always accepts the decoding result ĉ of BDD 300. In contrast, the SABM algorithm further checks the decoding status of BDD, as shown by the logic of the flow chart, to determine the decoding result to return.

Decision block 302 checks if BDD successfully decodes r, and if so, then miscorrection detection is performed in decision block 304. If there was no miscorrection, then the decoding result ĉ is returned. If BDD does not decode successfully, or if there is a miscorrection, then bit flipping (BF) by block 306 is performed as a way to handle decoding failures and miscorrections. Both the miscorrection decision block 304 and bit flipping block 306 use marked bits.

The SABM algorithm can in principle be applied to all received sequences r within L SCC blocks. However, due to the iterative sliding window decoding structure applied to SCCs, most of the errors are expected to be located in the last two blocks. To keep the complexity and latency low, it is preferred to use this algorithm on the received sequences from the last two blocks of the window. Therefore, from now on we only consider rows of the matrix $[Y^T_{i+L-2} Y_{i+L-1}]$.

Decoding Success: Improved Miscorrection Detection

To avoid miscorrections, others have proposed rejecting the decoding result of BDD applied to $[Y^T_{i+L-2} Y_{i+L-1}]$ if the decoded codeword would cause conflicts with zero-syndrome codewords in $[Y^T_{i+L-3} Y_{i+L-2}]$. That method protects bits in $Y_{i+L-2}$ but cannot handle bits in the last block $Y_{i+L-1}$. Instead, the present algorithm uses marked bits in $Y_{i+L-1}$. In the present embodiment, we add the additional constraint that no HRBs in $Y_{i+L-1}$ shall ever be flipped.

The reliability of a bit is given by the absolute value of its LLR, where a high value indicates a more reliable bit. A predetermined threshold δ is selected to decide if a bit is a highly reliable bit (HRB). If $|\lambda_{l,k}|>\delta$, the corresponding bit is marked as an HRB. The decision of the staircase decoder will therefore be marked as a miscorrection if the decoded codeword causes conflicts with zero-syndrome codewords in $[Y^T_{i+L-3} Y_{i+L-2}]$, or if the decoded codeword flips a bit whose LLR satisfies $|\lambda_{l,k}|>\delta$.

Example 1

Figure 4:
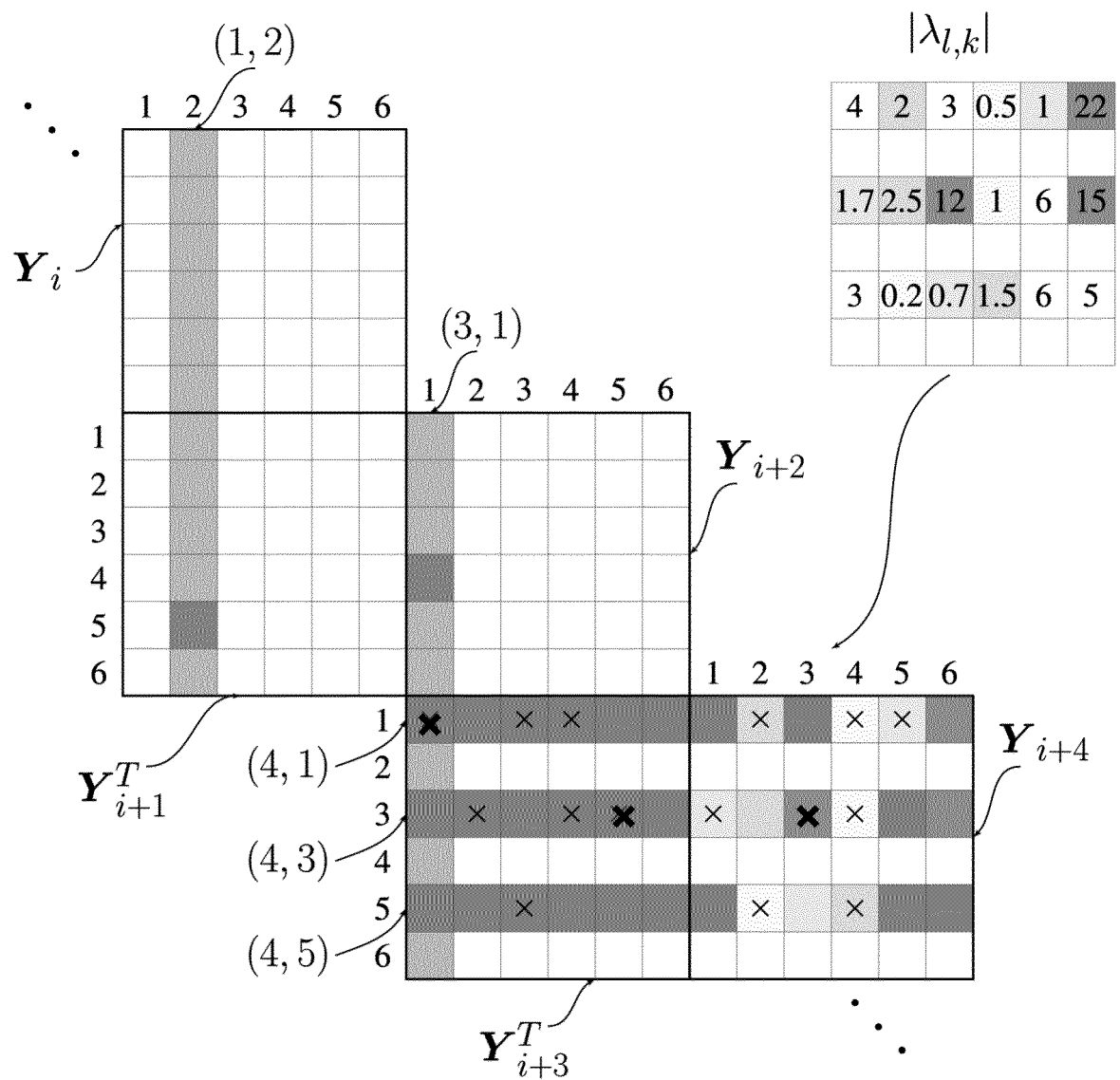
FIG. 4 is a schematic diagram of a decoding window illustrating an example decoding of a staircase code according to an embodiment of the invention.

FIG. 4 shows a decoding window with w=6 and L=5 and a component code C with t=2 ($d_0$=6).

A pair (i,j) is used to specify the location of a component codeword in each window, where $i \in \{1, 2, \ldots, L-1\}$ indicates the position relative to the current window and $j \in \{1, 2, \ldots, w\}$ indicates the corresponding row or column index in the matrix of two neighbor blocks. A triple (i, j, k) is used to indicate the k-th bit in the component codeword (i, j), where $k \in \{1, 2, \ldots, 2w\}$. For example, the component codewords (1, 2) and (3, 1) are shown as shaded columns, while bits (1, 2, 11) and (3, 1, 4) are cells in these columns with darker shading. The bit sequence (3, 1) is a codeword in $[Y^T_{i+2} Y_{i+3}]$ whose syndrome is equal to zero.

In the figure, thin crosses are received errors after channel transmission and thick crosses indicate miscorrections after BDD. Block $Y_{i+4}$ is shown in more details with values of $|\lambda_{l,k}|$ indicated. Cells with values {12, 15, 22} greater than threshold δ=10 are shaded dark and marked HRBs, while cells with values less than δ=10 shaded light and are marked HUBs.

After transmission, the received bit sequences for (4, 1) and (4, 3) have 5 and 4 errors, respectively, indicated by cells with thin crosses. When applying BDD, miscorrections (thick crosses) occur. For the received bits in (4, 1), BDD mistakenly detects bit (4, 1, 1) as an error and suggests to flip it. For the received bits in (4,3), the suggested flipping bit (4, 3, 5) in $Y_{i+L-2}$ is also suggested to flip, even though it is not involved in any zero-syndrome codewords. However, the bit (4,3,9) is a HRB, and thus, our MD algorithm will successfully identify it as a miscorrection.

The rule to never flip HRBs in $Y_{i+L-1}$ is only a heuristic and does not guarantee perfect MD. For example, our MD algorithm fails when no bits are flipped by BDD because $r=\tilde{c} \in C$. Nevertheless, as we will see later, our MD algorithm combined with bit flipping gives remarkably good results with very small added complexity.

Decoding Failures and Miscorrections: Bit Flipping

Returning to FIG. 3, in response to decoding failures and miscorrections, the algorithm will flip bits with block 306. The main idea is to flip certain bits in r and make the resulting sequence r' (after bit flipping) closer to c in Hamming space. In particular, the bit flipping aims at making the Hamming distance between r' and c equal to t, so that BDD 308 can correct r' to the transmitted codeword c. Two cases are considered by our algorithm: (1) decoding failures, and (2) miscorrections.

Case 1 (Decoding Failures): We target received sequences with t+1 errors. In this case, we flip a HUB with the lowest absolute LLR. The intuition here is that this marked bit was indeed one flipped by the channel. In the cases where the marked HUB corresponds to a channel error, the error correction capability of the code C is effectively increased by 1 bit.

Case 2 (Miscorrections): We target miscorrections where BDD chooses a codeword $\tilde{c} \in C$ at MHD of c. The intuition here is that most of the miscorrections caused by BDD will result in codewords at MHD from the transmitted codeword. When a miscorrection has been detected, our algorithm calculates the number of errors detected by BDD. This is equal to $d_H(r, \tilde{c}) = w_H(e)$. Then, our algorithm flips $d_0 - w_H(e) - t$ bits, which in some cases will result in r' that satisfy $d_H(c, r') = t$. This will lead BDD 308 to find the correct codeword. More details are given in Examples 2 and 3. Again using the intuition that bits with the lowest reliability are the most likely channel errors, our BF algorithm flips the most unreliable $d_0 - w_H(e) - t$ bits. In practice, this means that out of $n_c$ code bits per codeword, only $d_0 - w_H(e) - t \le t+1$ (or t+2 for extended BCH codes) HUBs need to be marked (and sorted). The BF block 306 chooses the number of marked bits to flip based on this sorted list and the Hamming weight of the error pattern.

Example 2

Figure 5:
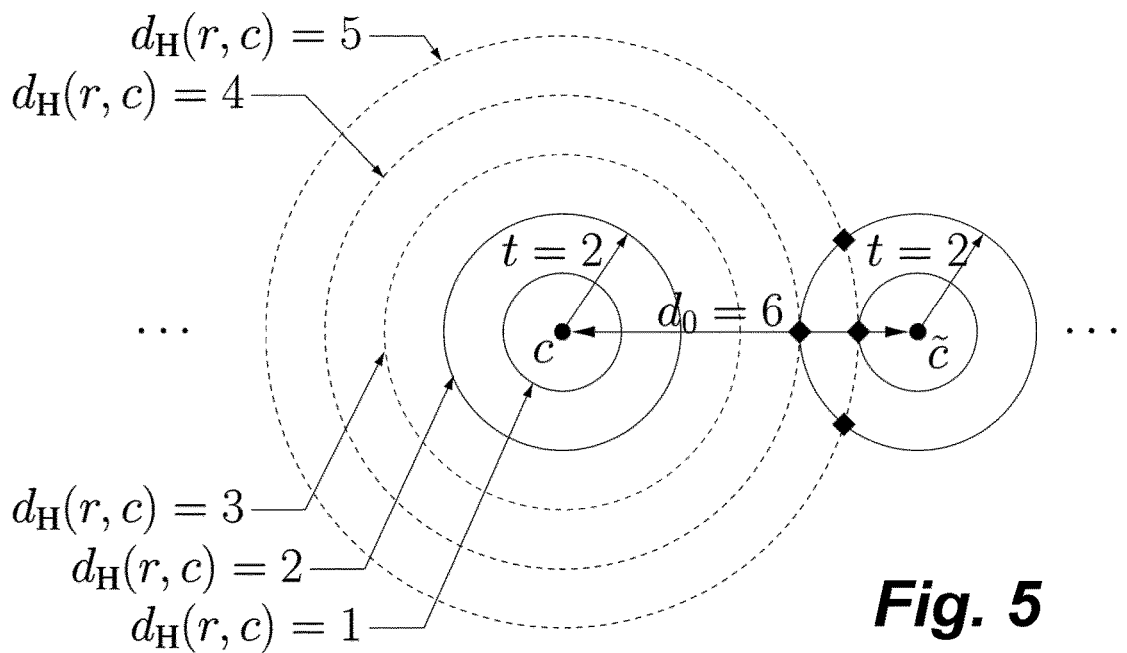
FIG. 5 is a schematic representation of bounding distance decoding (BDD) for an example of decoding a staircase code, according to an embodiment of the invention.

FIG. 5 illustrates bounding distance decoding (BDD) for an example with t=2 where c is the transmitted codeword and $\tilde{c} \in C$ is another codeword at MHD $d_0=6$. The circles around c show the possible locations of r with 1, 2, ... errors from inside to outside in turn, where the solid circles around c indicate cases that BDD will decode successfully. Diamonds indicate four possible locations where miscorrection happens.

Example 3

Cells, i.e., (4,5,8), (4,5,9) and (4,5,10), with the lowest values {0.2, 0.7, 1.5} of $|\lambda_{l,k}|$ in FIG. 4 indicate the marked 3 HUBs with the lowest reliability within that codeword. In this example, BDD fails to decode bit sequence (4, 5). Fortunately, (4, 5, 8) corresponds to the marked HUB with smallest $|\lambda_{l,k}|$. Thus, it will be flipped after BF, and then the remaining 2 errors (4, 5, 3) and (4, 5, 10) will be fully corrected by applying BDD again. This corresponds to Case 1.

For bit sequences (4,1) and (4,3), the decoding results of BDD are identified as miscorrections (as explained in Example 1) with $w_H(e)=1$ and $w_H(e)=2$, respectively. According to the BF rule for miscorrections, 3 and 2 bits with smallest $|\lambda_{l,k}|$ among the marked HUBs, i.e., (4,1,8), (4,1,10), (4,1,11) in (4,1), and (4,3,7), (4,3,10) in (4,3), will all be flipped. As a result, only 2 errors are left in (4,1) and (4,3), which are within the error correcting capability of BDD. This corresponds to Case 2.

Returning to FIG. 3, BF 306 will not always result in the correct decision. As shown in Example 2, this is the case for certain miscorrections (e.g., the two off-axis diamonds in FIG. 4). Additionally, miscorrections for codewords at distances larger than $d_0$ are not considered either. Finally, marked LLRs might not correspond to channel errors. In all these cases, either decoding failures or miscorrections will happen. To avoid these cases, after BF 306 and BDD 308 the SABM algorithm includes two final checks, successful decoding 310 and miscorrection detection 312, which uses marked bits.

Algorithm Optimization and Simulation Results

In this section, the component codes used for simulations are extended BCH codes with one extra parity bit and 2-error-correcting capability (t=2). The decoding window size is L=9, and the maximum number of iterations is l=7.

LLR Threshold Choice

One key aspect of the SABM algorithm is the selection of the bits to be marked as HRBs. This selection is based on the channel reliabilities, in particular, by using an LLR threshold δ. In order to optimize the process of marking bits as highly reliable, the LLR threshold needs to be selected.

Figure 6:
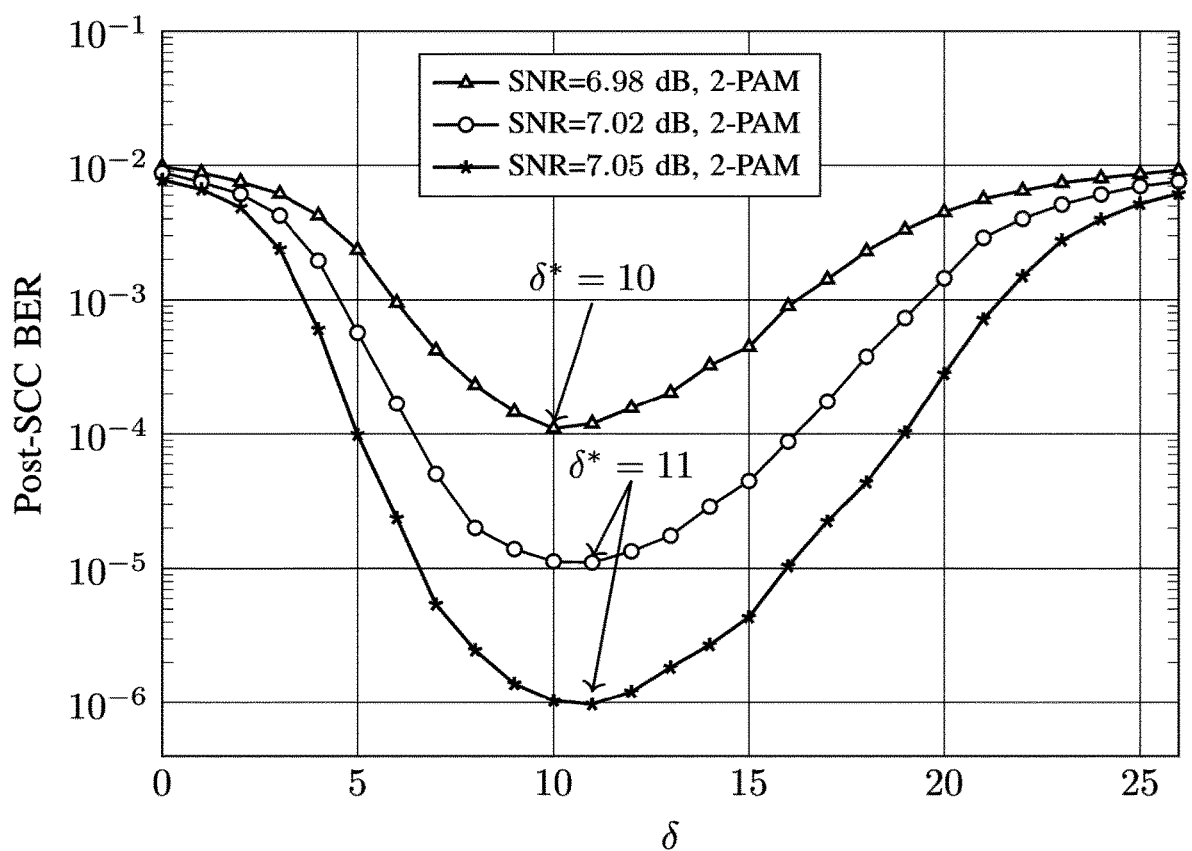
FIG. 6 is a graph showing Post-SCC bit error rate (BER) vs. the reliability (i.e., the absolute value of log-likelihood ratios (LLR)) threshold $\delta$ for code rate R=0.87 and 2-PAM.

We first consider an SCC with R=0.87, whose component code is BCH(256,239,2) (w=128). FIG. 6 shows the post BER performance under different values of threshold δ. The modulation format is 2-PAM. The three curves are obtained for SNRs of 6.98 dB (triangles), 7.02 dB (circles) and 7.05 dB (stars), respectively. These SNRs are chosen so that the achieved BERs are $10^{-4}$, $10^{-5}$ and $10^{-6}$, respectively. FIG. 6 shows that, to obtain the best performance, the corresponding optimum threshold δ* is 10, 11 and 11. However, the difference between these values is small, and the resulting performance difference is negligible as long as δ≈10. It is important to note that this difference becomes important for optical transmission experiments. For example, the optimum value δ* for a long-haul system was found to be as low as δ*=4.

The U-type trend results in FIG. 6 can be intuitively understood as follows. For values of δ less than δ*, the performance degrades because some of the bits that are not reliable enough are marked as HRBs. This will lead to some correct BDD decisions being mistakenly marked as miscorrections, which are then rejected by the SABM-based staircase decoder. On the other hand, the performance degradation for values of δ greater than δ* is due to the fact that some of the bits that should probably be trusted are not marked as HRBs. This weakens the ability of the SABM algorithm to identify miscorrections.

Figure 7:
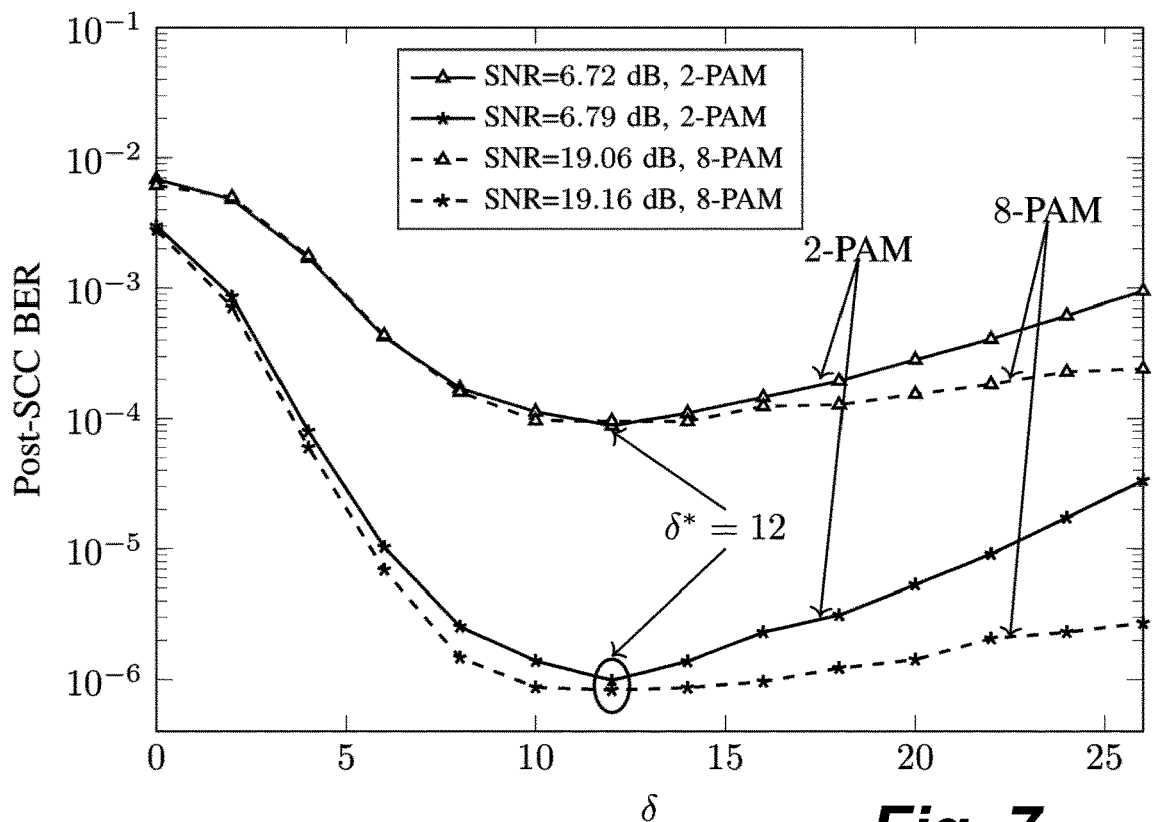
FIG. 7 is a graph showing Post-SCC bit error rate (BER) vs. the reliability (i.e., the absolute value of log-likelihood ratios (LLR)) threshold $\delta$ for code rate R=0.83.
Figure 8:
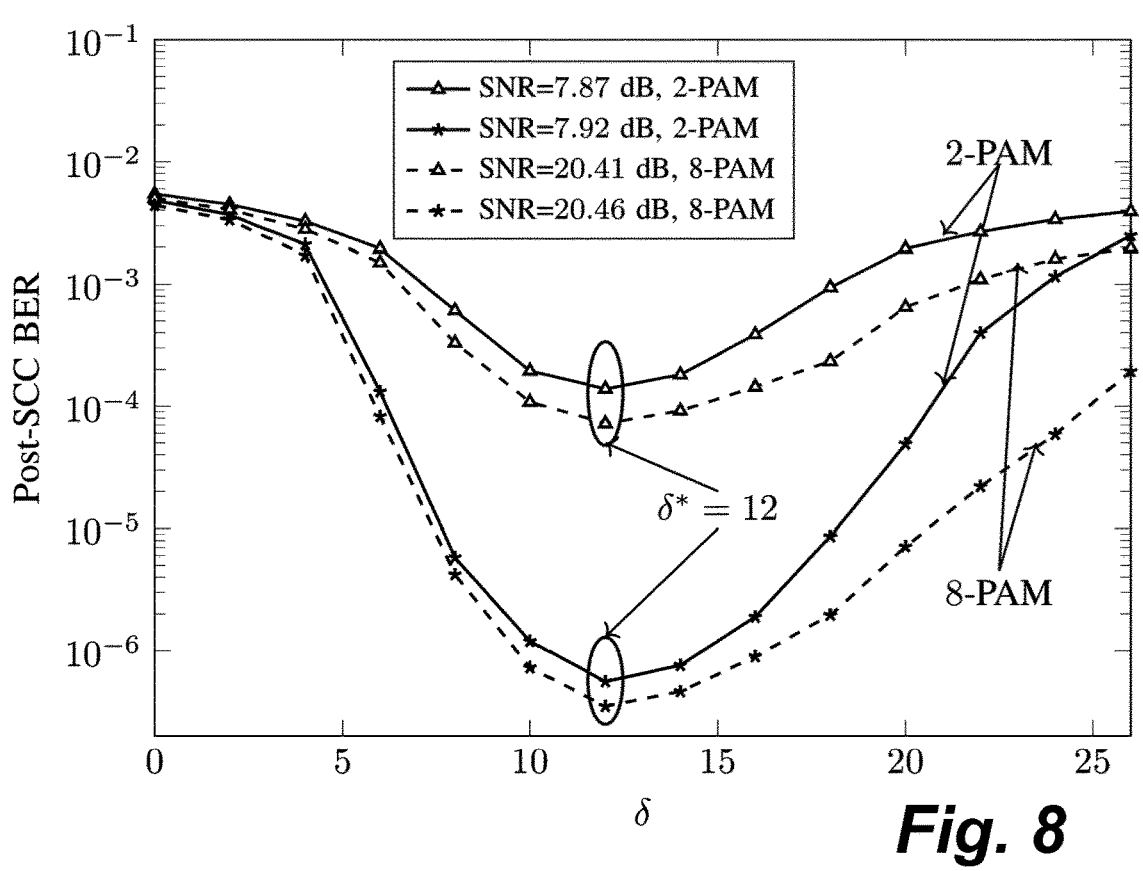
FIG. 8 is a graph showing Post-SCC bit error rate (BER) vs. the reliability (i.e., the absolute value of log-likelihood ratios (LLR)) threshold $\delta$ for code rate R=0.92.

FIG. 7 and FIG. 8 show the post BER performance vs. δ for SCC code rates of R=0.83 and 0.92, respectively. The modulation formats include 2-PAM (solid lines) and 8-PAM (dashed lines).

The corresponding component codes we used are BCH (228,209,2) and BCH(504,485,2). These parameters are obtained by shortening the extended BCH(512, 493, 2) by 284 and 8 bits, respectively. We investigate the BER performance under two SNRs for each code rate. Furthermore, we investigate two modulation formats: 2-PAM (solid lines) and 8-PAM (dashed lines). The results in FIG. 7 and FIG. 8 show that for both code rates and modulation formats, the optimum threshold is δ*=12, which is slightly larger than the one in FIG. 6. FIG. 7 and FIG. 8 also show that SCCs with 8-PAM are less sensitive to an overestimation of the optimum value of δ* than SCC with 2-PAM. This can observed by the relatively flat BER curves for 8-PAM when δ>δ*.

Post-BER Performance Analysis

Figure 9:
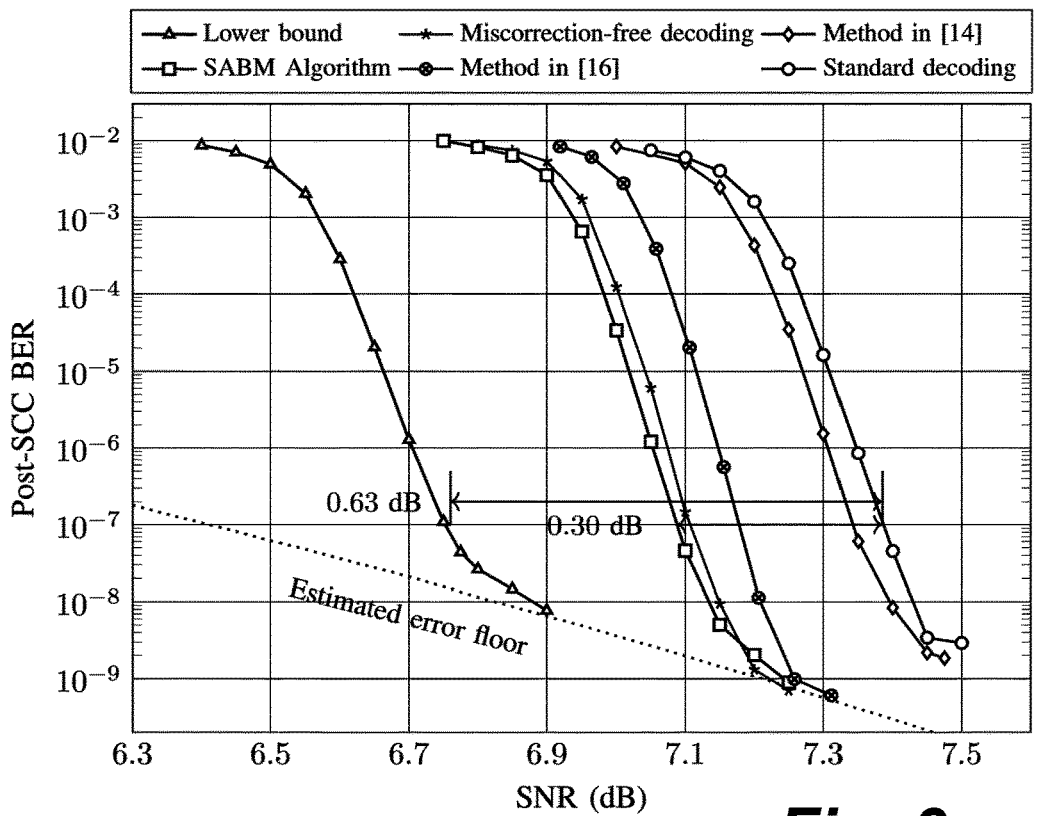
FIG. 9 is a graph showing Post-SCC BER vs. SNR for code rate R=0.87 and 2-PAM.

FIG. 9 shows the BER performance vs. SNR for R=0.87 and 2-PAM. The dotted line is the estimated error floor of standard SCC decoding based on Eq. 3. As suggested by the results in FIG. 6, the LLR threshold to qualify HRBs is set to the optimum value at the point of SNR=6.98 dB that $\delta=\delta^*=10$. Two baselines are: standard decoding where miscorrections are not dealt with (circles), and miscorrection-free decoding (stars). The latter is obtained via a genie BDD decoder which corrects the received sequence only when the number of errors is not more than t. The dotted curve shows the estimated error floor of standard SCC decoding. It only considers the main contributor of minimal stall pattern, estimated as $$BER_{post} \approx \frac{(t+1)^2}{w^2} M_{min} BER_{pre}^{(t+1)^2} \text{ where} \qquad (3)$$

$$M_{min} = \binom{w}{t+1} \sum_{m=1}^{(t+1)} \binom{w}{m}\binom{w}{t+1-m}.$$

and $BER_{pre}$ is the channel error probability. This figure also shows the performance of previously proposed methods, shown as diamonds and crossed circles. The reason why there is a quite high error floor in FIG. 9 is the relatively short SCC and small error-correcting capability we used. Longer SCC or larger error-correcting capability codes do not have an error floor above BER=$10^{-15}$.

As shown in FIG. 9, the SABM algorithm (shown with squares) out-performs standard decoding by 0.3 dB and also outperforms other approaches to improve standard decoding, which only prevent miscorrections, and thus, their performance is bounded by the miscorrection-free case. Although the SABM algorithm only deals with miscorrections related to the last block of each window, it outperforms the miscorrection-free case. This is due to its additional ability to better deal with miscorrections and decode even when BDD initially fails. In terms of error floor, it can be found that the performance of the SABM algorithm is lower than standard decoding, and close to the miscorrection-free case.

FIG. 9 also shows a lower bound for the SABM algorithm (triangles). This bound is obtained by a genie decoder which emulates a best-case scenario for the SABM algorithm. This genie decoder is assumed to be able to ideally identify all miscorrections in the last two blocks of the window. This corresponds to have an idealized MD block (304 and 312, FIG. 3). The genie decoder also emulates an idealized assumption on what the BF block (306, FIG. 3) can do. For this, we assume that the decoder knows exactly which bits in the last two blocks are errors. If a given sequence has t+j errors (j=1 for Case 1, or $j=d_0-w_H(e)-t$ for Case 2), and at least j errors are located in the last block, the genie decoder flips j errors in the last block, and then the received sequence is correctly decoded. If less than j errors are located in the last block, the genie decoder declares a failure. The results in FIG. 9 show that the maximum potential gain for our receiver structure (for 2-PAM, R=0.87, and t=2) is 0.63 dB. The SABM algorithm almost achieved half of this gain with very small added complexity.

Figure 10:
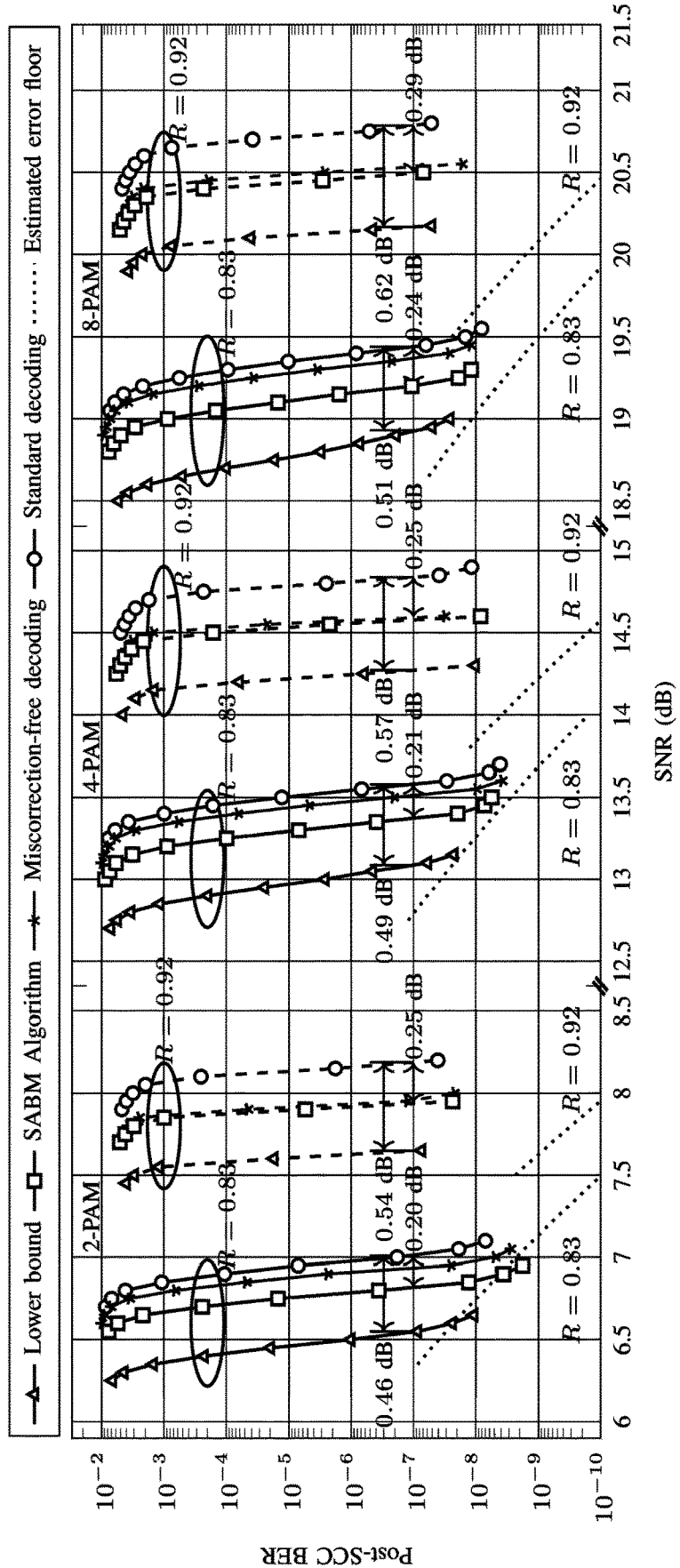
FIG. 10 is a graph showing Post-SCC BER vs. SNR for code rates R=0.83 (solid lines) and R=0.92 (dashed lines) with 2-PAM, 4-PAM, and 8-PAM modulation formats.

FIG. 10 shows the simulation results of the SABM algorithm for R=0.83 and 0.92. The dotted lines between triangles are the estimated error floors of standard SCC decoding based on Eq. 3. For each code rate, three modulation formats are considered: 2-PAM, 4-PAM and 8-PAM. As shown in FIG. 6, FIG. 7, and FIG. 8, using an optimized $\delta^*$ for each code rate and modulation format gives the best BER. However, for simplicity, the LLR threshold we use here is set to 6=10. Because the codeword length of SCCs with R=0.92 is too long, i.e., each SCC block contains 63,504 bits, it is very time-consuming to run simulations below $10^{-9}$. Hence, we only show results for the waterfall region for SCCs with R=0.92. It can be seen from FIG. 10 that for different modulation formats and code rates, the SABM algorithm always outperforms the miscorrection-free case, also on the error floor region for R=0.83. When compared to standard staircase decoding, the achieved gains are between 0.20 dB and 0.29 dB, while the obtained maximum potential gains are between 0.46 dB and 0.62 dB at the BER of $10^{-7}$. The results in FIG. 10 also show that the gains increase as the modulation size increases.

Complexity Analysis

The number of calls to the component BDD decoder is a key factor defining the complexity and latency for iterative decoding of SCCs. In order to deal with BDD decoding failures and miscorrections, the SABM algorithm needs to call the component BDD decoder multiple times (once after every BF operation). These additional calls will increase the SCC decoding complexity and latency. To quantify this, we estimate the average number of calls to the component BDD decoder within one decoding window. The relative complexity increase caused by the SABM algorithm with respect to standard SCC decoding is thus given by $$\eta \triangleq \frac{\bar{N} - N_{sd}}{N_{sd}} = \frac{\bar{N} - w(L-1)\ell}{w(L-1)\ell}, \qquad (4)$$

where $\bar{N}$ and $N_{sd}$ are the number of BDD calls for the SABM algorithm and for the standard SCC decoding, respectively. In what follows we estimate the value of $\eta$ in Eq. 4 by estimating the average $\bar{N}$ using the first 10,000 decoding windows.

Figure 11:
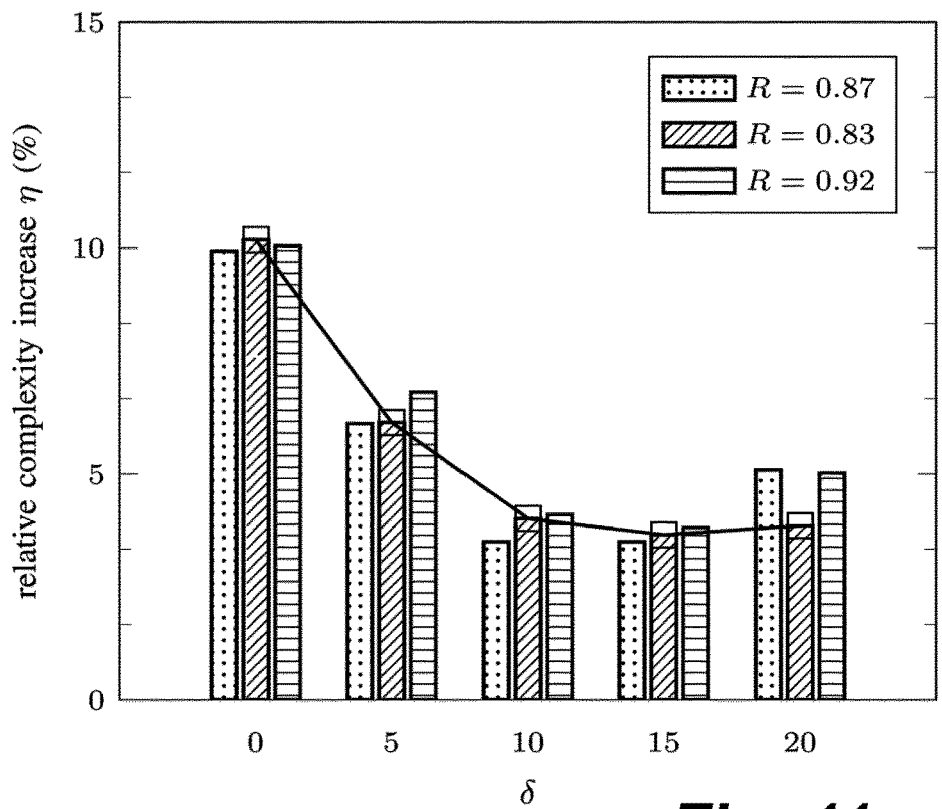
FIG. 11 is a graph showing the relative complexity increase $\eta$ vs. $\delta$ with L=9, l=7 and 2-PAM.

FIG. 11 shows the relative complexity increase $\eta$ under different LLR threshold $\delta$. The SNRs are 6.98 dB, 6.72 dB and 7.87 dB, which result in a post-SCC BER of $10^{-4}$ under $\delta=10$, 2-PAM, and code rates R=0.87, 0.83 and 0.92, respectively. The number of calls to BDD for the standard SCC decoding are $N_{sd}$=7168, 6384 and 14112 for code rates R=0.87, 0.83 and 0.92, respectively. The fitted curve in FIG. 11 is used to better show the trend of the increased complexity of SCC with R=0.83. The other two code rates show a similar trend (not shown in this figure). The results in FIG. 11 show that the relative complexity increase around the optimum LLR threshold $\delta^*$ ($\delta^* \approx 10$ for R=0.87, $\delta^*=12$ for R=0.83 and 0.92) is the least, and is only around 4%. If $\delta$ is too small, more outputs of BDD will be mistakenly identified as miscorrections. Consequently, the SABM-based staircase decoder will recall BDD for each marked miscorrection to try to decode it, thus lead to an increased additional calls to BDD. On the other hand, if $\delta$ is higher than the optimum threshold $\delta^*$, there are less bits marked as HRB, and thus, miscorrections cannot be identified effectively. More errors (caused by miscorrections) will then be added to the received sequences. As a consequence, decoding failure happens more often in the following iterations. Similarly, the SABM-based staircase decoder will recall BDD to try to decode each BDD decoding failure. Therefore, the complexity increases slightly in this case too.

Figure 12:
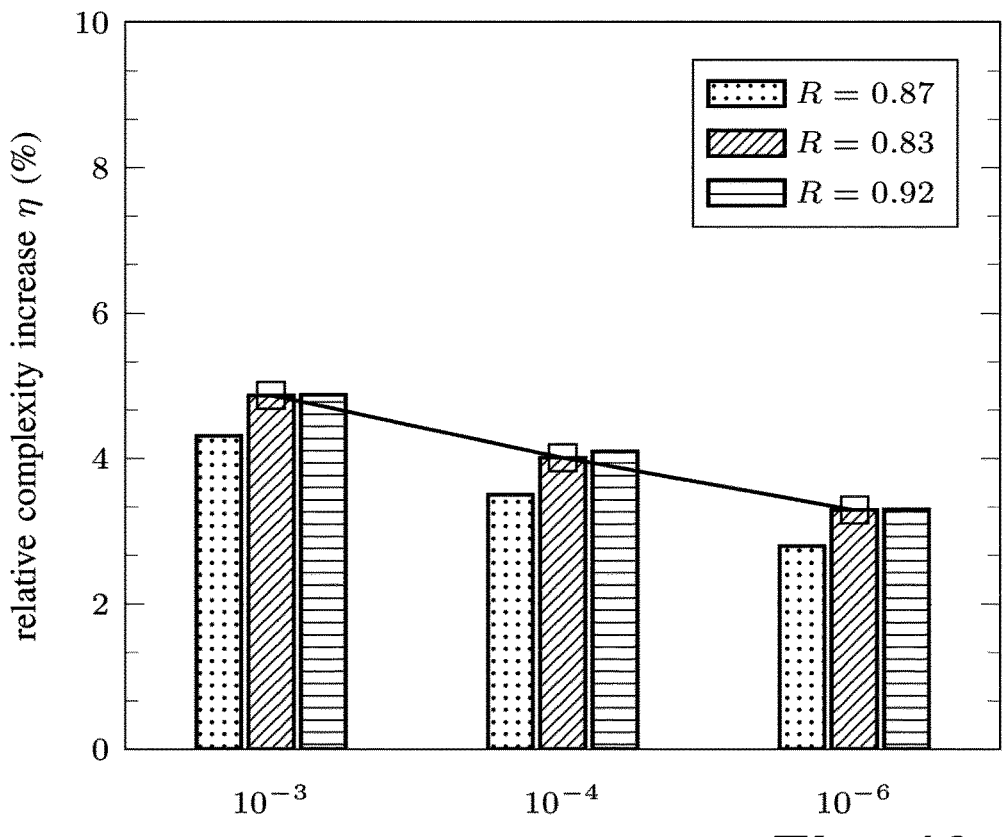
FIG. 12 is a graph showing the relative complexity increase $\eta$ vs. post-BER with $\delta$=10, L=9, l=7 and 2-PAM.

FIG. 12 shows the relative complexity increase $\eta$ of the SABM algorithm under different post-SCC BER. Similarly to FIG. 11, the fitted curve is used to better show the trend of the increased complexity of SCC with R=0.83. The LLR threshold used was δ=10. When the SNR increases, there are less errors in the received sequence and most of the time BDD can deal with them successfully. Therefore, the case of decoding failure or miscorrection happens less frequently, leading to a decreased additional calls to BDD in the SABM algorithm. This effect is shown in FIG. 12, where the relative complexity increase reduces as the channel condition improves. In the asymptotic case (SNR tending to infinity), the total number of BDD calls in the SABM algorithm will approach that of the standard SCC decoding, and thus, η→0.

Extension to Product Codes

The decoding technique based on bit marking can be used for various HD-FEC codes, including product codes. A product code is a set of square arrays of size $n_c \times n_c$, constructed in such a way that every rows or column is an allowed codeword in some component (block) code ($n_c$, $k_c$, t). Multiple algorithms exist to improve the decoding performance of PCs while keeping a manageable decoding complexity. We now describe another embodiment of the SABM algorithm which can be used for decoding PCs. This will be described as an adaptation of the embodiment for SCCs.

SABM Algorithm for PC Decoding

In the SCC case, both MD and BF are applied only to the last block in the decoding window exploiting the channel reliabilities (LLRs). This is justified by the fact that the last block contains less reliable bits as no previous decoding iterations were performed on it. Differently from SCCs, in the PC case, row and column decoding are performed iteratively within the same block. As a result, no bits within each block can be regarded as more or less reliable than others, and conflicts between column and row decoding are likely to arise. Thus, one may expect to obtain gains only when MD and BF is performed within the first decoding iterations.

In particular, it was found that in order to achieve the optimal decoding performance for SCCs, the SABM algorithm is implemented to perform MD and BF only within the first decoding iteration and the first half of the second iteration (row decoding). Extending beyond the second iteration was observed to degrade the decoding performance, hypothetically due to conflicts between row and column decodings. Furthermore, the BF is only adopted in case of decoding failure (HUB flipping) and not in the case of miscorrection. As for the row decoding operated in the first iteration, MD is only operated based on the marked HRBs, since no previous information on the codeword syndromes is available from the decoder. From the first column decoding onwards, MD is based on both bit marking or syndrome information. The reliability threshold to mark the bits was also optimized for the PC case and the optimal value was found to be identical to the case of SCC, δ=δ*=10.

B. Post-BER Performance Analysis

We consider 3 different PCs based on 1-bit extended BCH codes as component codes with the following parameters (128,113,2), (256,239,2), and (512,493,2). These parameters result in a 128×128, 256×256, and 512×512 PC code arrays with overall code rate R=0.78, 0.87 and 0.93, respectively.

Figure 13:
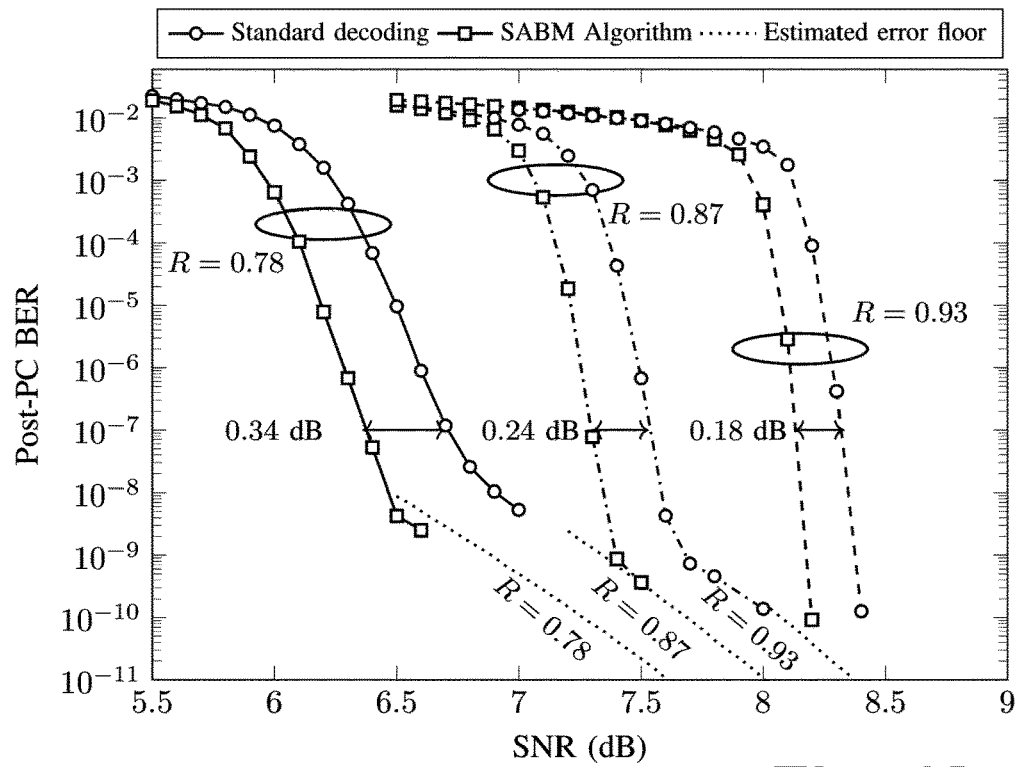
FIG. 13 is a graph showing Post-PC BER vs. SNR for code rates R=0.78, 0.87 and 0.93 with 2-PAM.

The results are shown in FIG. 13 for an AWGN channel and for a 2-PAM modulation format. Dotted lines are the estimated error floors of standard PC decoding calculated by using Eq. 3 but with $$M_{min} = \left(\frac{w}{t+1}\right)^2.$$

The corresponding w=$n_c$=128, 256, and 512. The achieved additional gains at BER of $10^{-7}$ are 0.34 dB, 0.24 dB, and 0.18 dB for R=0.78, 0.87 and 0.93, respectively. Although the obtained gain is comparable with existing techniques, the SABM algorithm is much simpler because it is only applied in the first 1.5 iterations and there is no need to track the change of the flipped bits.

CONCLUSIONS

The SABM decoding algorithm uses a modification of the standard hard-decision-based forward error correction decoder and relies on the idea of marking bits. Embodiments of the algorithm use an improved miscorrection-detection mechanism and a bit-flipping operation to effectively prevent miscorrections and increase the error correcting capability of bounded-distance decoding. Large gains compared to standard SCC decoding are obtained with a very low added complexity. The algorithm is applicable to staircase codes and also to product codes with a similar performance improvement.

The invention claimed is:

1. A method for decoding a hard-decision (HD) forward error correcting (FEC) coded signal received by a device over a communication channel, the method comprising: decoding the HD-FEC coded signal by the device to produce decoded bits; wherein the decoding uses marked reliable bits of the HD-FEC coded signal and marked unreliable bits of the HD-FEC coded signal.

2. The method of claim 1, wherein the decoding comprises: estimating code bits from the coded signal by an HD-based demapper; and generating the decoded bits from the estimated code bits by an HD-FEC decoder.

3. The method of claim 1, wherein the decoding comprises: computing the marked bits based on an absolute value of log-likelihood ratios (LLRs) of the HD-FEC coded signal.

4. The method of claim 1, wherein the decoding comprises: marking a bit of the HD-FEC coded signal as a reliable bit whenever an absolute value of a log-likelihood ratio for the bit exceeds a predetermined threshold δ.

5. The method of claim 4, wherein δ=10, or δ=11, or δ=12.

6. The method of claim 1, wherein the decoding comprises: sorting bits of the HD-FEC coded signal by the log-likelihood ratios for the bits and marking a subset of the sorted bits having lowest log-likelihood ratios as unreliable bits.

7. The method of claim 1, wherein the communication channel is optical, wired, or wireless.

8. The method of claim 1, wherein the hard-decision (HD) forward error correcting (FEC) coded signal is a staircase code (SCC) coded signal, a product code (PC) coded signal, a Hamming code coded signal, a BCH code coded signal, or a Reed-Solomon code coded signal.

9. The method of claim 1, wherein the decoding comprises detecting miscorrections and flipping bits whenever a miscorrection is detected.

10. A device for decoding a hard-decision (HD) forward error correcting (FEC) coded signal received by the device, the device comprising:

a bit-marking circuit adapted to produce marked reliable bits of the HD-FEC coded signal and marked unreliable bits of the HD-FEC coded signal;

an HD-FEC decoder adapted to decode the HD-FEC coded signal received by the device to produce decoded bits; wherein the HD-FEC decoder uses the marked reliable bits and the marked unreliable bits.

11. The device of claim 10, wherein the HD-FEC decoder comprises an HD-based demapper adapted to estimate code bits from the coded signal; and a bounded distance decoder (BDD) adapted to decode the decoded bits from the estimated code bits using the marked reliable bits and the marked unreliable bits.

12. The device of claim 10, wherein the bit-marking circuit is adapted to compute the marked reliable bits and the marked unreliable bits based on an absolute value of log-likelihood ratios (LLRs) of the HD-FEC coded signal.

13. The device of claim 10, wherein the bit-marking circuit is adapted to mark a bit of the HD-FEC coded signal as a reliable bit whenever an absolute value of a log-likelihood ratio for the bit exceeds a predetermined threshold $\delta$.

14. The device of claim 13, wherein $\delta=10$, or $\delta=11$, or $\delta=12$.

15. The device of claim 10, wherein the bit marking circuit is adapted to sort bits of the HD-FEC coded signal by the log-likelihood ratios of the bits and to mark a subset of the sorted bits having lowest log-likelihood ratios as unreliable bits.

16. A system for communicating a hard-decision (HD) forward error correcting (FEC) coded signal, the device comprising:

a transmitter adapted to transmit the hard-decision (HD) forward error correcting (FEC) coded signal;

a receiver adapted to receive the hard-decision (HD) forward error correcting (FEC) coded signal; wherein the receiver comprises:

a bit-marking circuit adapted to produce marked reliable bits of the HD-FEC coded signal and marked unreliable bits of the HD-FEC coded signal;

an HD-FEC decoder adapted to decode the HD-FEC coded signal received by the device to produce decoded bits; wherein the decoder uses the marked reliable bits and the marked unreliable bits.

17. The system of claim 16, wherein the HD-FEC decoder comprises an HD-based demapper adapted to estimate code bits from the coded signal; and a bounded distance decoder (BDD) adapted to decode the decoded bits from the estimated code bits using the marked reliable bits and the marked unreliable bits.

18. The system of claim 16, wherein the bit-marking circuit is adapted to compute the marked reliable bits and the marked unreliable bits based on an absolute value of log-likelihood ratios (LLRs) of the HD-FEC coded signal.

19. The system of claim 16, wherein the bit-marking circuit is adapted to mark a bit of the HD-FEC coded signal as a reliable bit whenever an absolute value of a log-likelihood ratio for the bit exceeds a predetermined threshold $\delta$.

20. The system of claim 16, wherein the bit marking circuit is adapted to sort bits of the HD-FEC coded signal by the log-likelihood ratios of the bits and to mark a subset of the sorted bits having lowest log-likelihood ratios as unreliable bits.

* * * * *